(12) United States Patent
Edo

(10) Patent No.: US 6,940,763 B2
(45) Date of Patent: Sep. 6, 2005

(54) CLOCK SYNCHRONOUS TYPE SEMICONDUCTOR MEMORY DEVICE

(75) Inventor: Sachiko Edo, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/790,740

(22) Filed: Mar. 3, 2004

(65) Prior Publication Data

US 2004/0174751 A1 Sep. 9, 2004

(30) Foreign Application Priority Data

Mar. 7, 2003 (JP) ......................................... 2003-061420

(51) Int. Cl.[7] .............................................. G11C 7/00
(52) U.S. Cl. ................................. 365/193; 365/230.06
(58) Field of Search ................................ 365/193, 191, 365/230.08, 189.05, 189.12, 195, 230.06, 233

(56) References Cited

U.S. PATENT DOCUMENTS

| | | | | |
|---|---|---|---|---|
| 5,592,434 A | * | 1/1997 | Iwamoto et al. | 365/233 |
| 5,892,730 A | * | 4/1999 | Sato et al. | 365/233 |
| 5,926,434 A | * | 7/1999 | Mori | 365/233 |
| 6,029,250 A | * | 2/2000 | Keeth | 713/400 |
| 6,154,417 A | * | 11/2000 | Kim | 365/233 |

FOREIGN PATENT DOCUMENTS

| | | |
|---|---|---|
| JP | 8-129887 A | 5/1996 |
| JP | 10-199251 A | 7/1998 |
| JP | 2000-285687 A | 10/2000 |

* cited by examiner

Primary Examiner—Thong Q. Le
(74) Attorney, Agent, or Firm—Sughrue Mion, PLLC

(57) ABSTRACT

A synchronous type semiconductor memory device includes a memory cell array in which memory cells are arranged in a matrix; a row address decoder which activates one of word lines in said memory cell array based on a row address in response to a word activation signal; a column decoder which activates one of bit line pairs in said memory cell array based on a column address; and a sense amplifier circuit which amplifies a voltage difference on the activated bit line pair in response to a sense amplifier activation signal. The synchronous type semiconductor memory device further includes a clock data storage section which stores clock data showing a frequency or period of an external clock signal; and a control section which generates the word activation signal based on a row address strobe signal, and generates the sense amplifier activation signal based on the clock data and the row address strobe signal in response to an internal clock signal synchronous with the external clock signal.

20 Claims, 9 Drawing Sheets

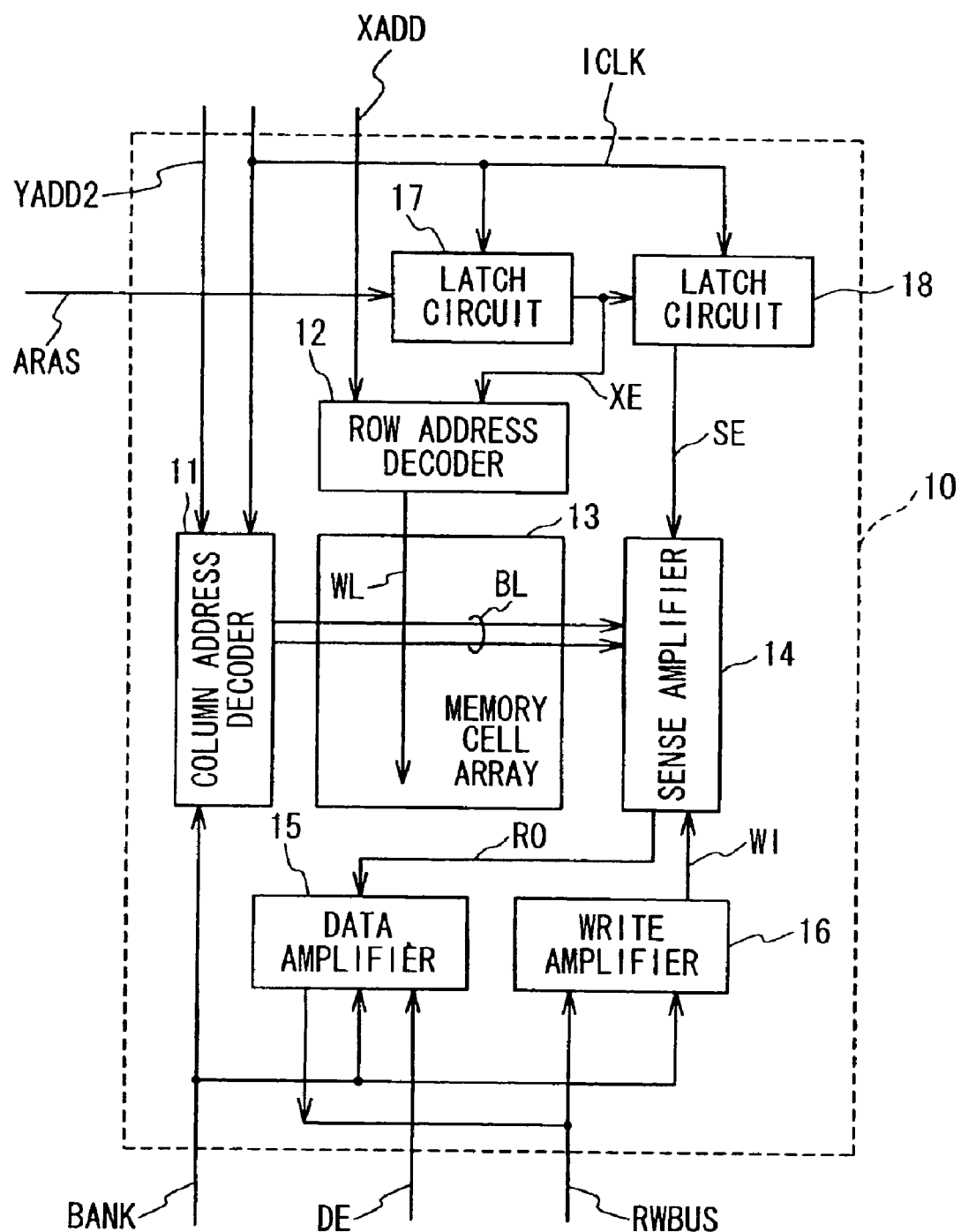

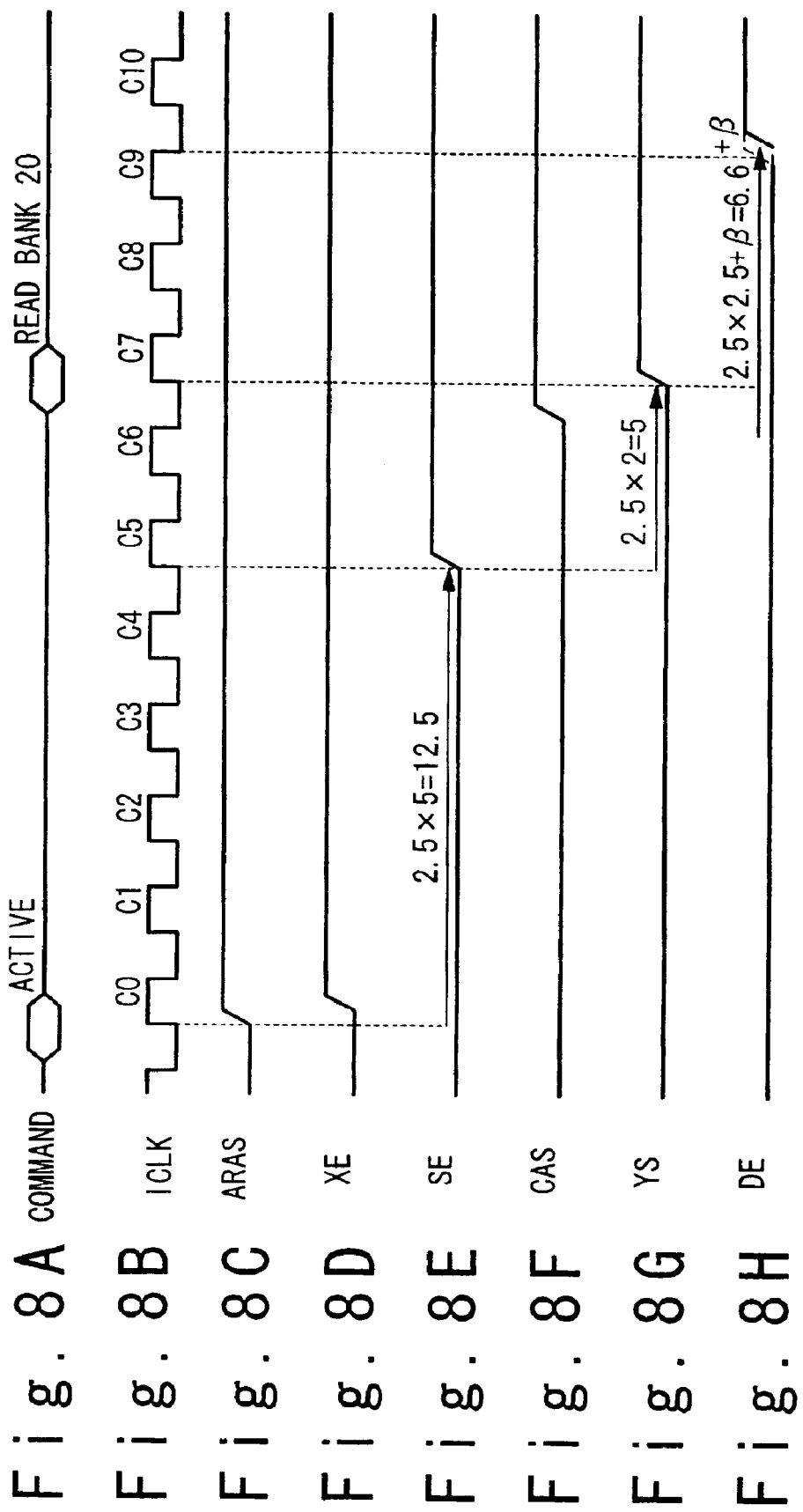

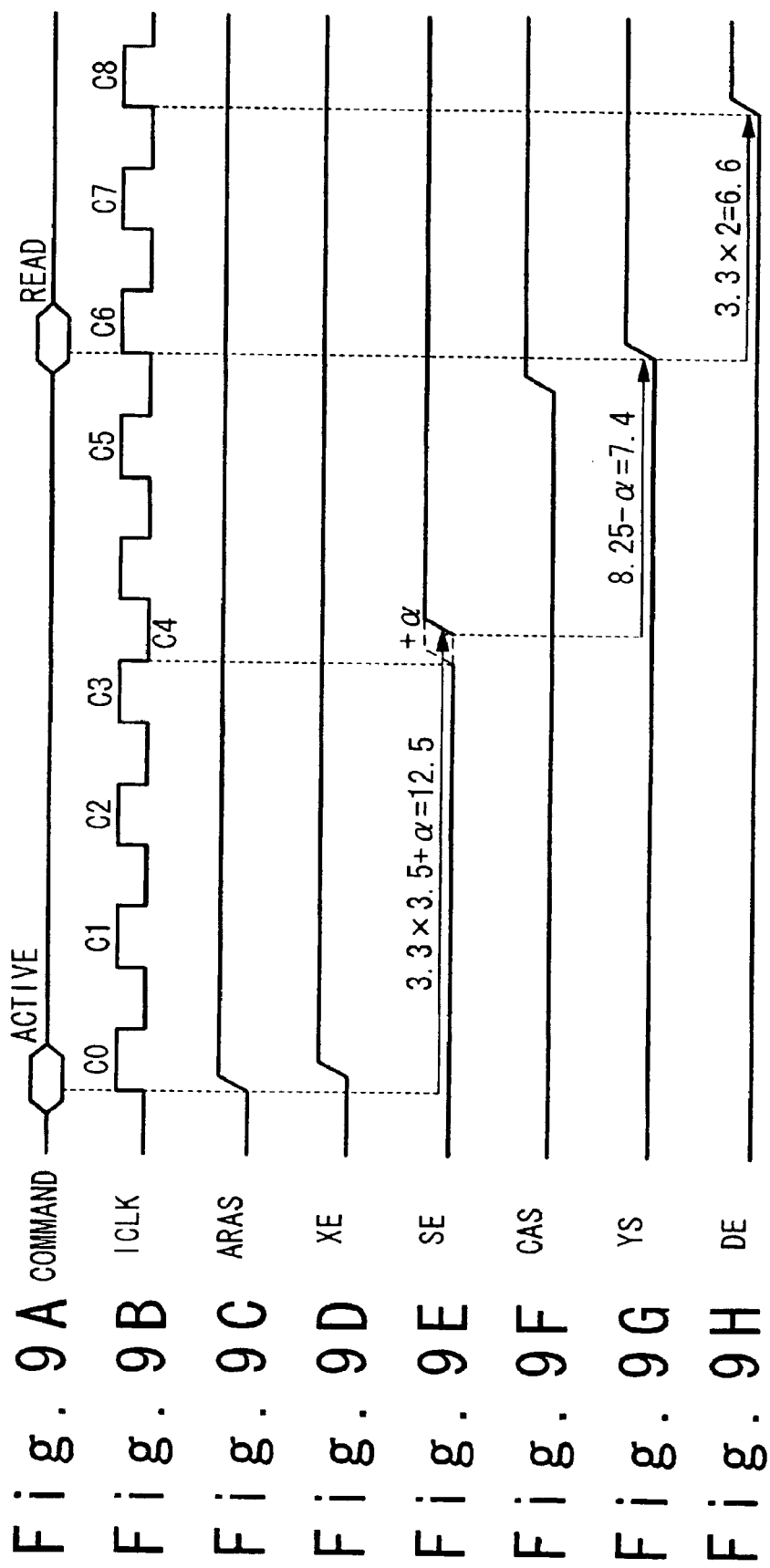

CLOCK SYNCHRONOUS TYPE SEMICONDUCTOR MEMORY DEVICE

BACKGROUND OF THE INVENTION

1. Field of the Invention

The present invention relates to a semiconductor memory device operating in synchronism with an external clock signal.

2. Description of the Related Art

A conventional clock synchronous type semiconductor memory device is described in Japanese Laid Open Patent Application (JP-A-Heisei 8-129887). The structure and operation of the conventional clock synchronous type semiconductor memory device will be described with reference to FIG. 1. The conventional clock synchronous type semiconductor memory device operates in synchronism with an external clock signal and has a plurality of memory blocks called banks. Each of the banks is specified based on a bank address. Control signals and an address signal are supplied from external connection terminals in synchronism with the external clock signal. An internal clock signal ICLK is generated in synchronism with the external clock signal supplied from the external connection terminal and is supplied to each section of the memory device. A command is supplied through a plurality of control lines in synchronism with the clock signal. The inputted command is interpreted by a command decoder. The command decoder is a state machine, and determines the operation of the memory device based on the command. Then, the command decoder generates internal control signals such as row address strobe signals ARAS and BRAS, a column address strobe signal CAS, a read signal READ, a write signal WRITE, and a bank activation signal BANK in synchronism with the internal clock signal ICLK.

The bank 10 is composed of a memory cell array 13, latch circuits 17 and 18, a column address decoder 11, a row address decoder 12, a sense amplifier 14, a data amplifier 15 and a write amplifier 16.

The memory cell array 13 has a plurality of memory cells arranged in a matrix. The plurality of memory cells are connected one of word lines and one of bit lines. The latch circuit 17 receives the row address strobe signal ARAS and generates a word activation signal XE in synchronism with the internal clock signal ICLK. The latch circuit 18 generates a sense amplifier activation signal SE by delaying the word activation signal XE by one clock of the internal clock signal ICLK. The row address decoder 12 selects one of the word lines WL based on a row address signal XADD in synchronism with the word activation signal XE. The column address decoder 11 receives a column address signal YADD2 and a bank activation signal BANK, and selects one of bit line pairs BL in synchronism with the internal clock signal ICLK.

In case of a read operation, the sense amplifier 14 amplifies data read out from the memory cell array 13 on the selected bit line pair BL in response to the sense amplifier activation signal SE, and outputs a read data signal RO to the data amplifier 15. The data amplifier 15 amplifies the read data signal RO based on the bank activation signal BANK in response to a data amplifier activation signal DE and outputs the amplified data signal on an internal bus RWBUS. In case of a write operation, the write amplifier 16 amplifies a data signal on the internal bus RWBUS based on the bank activation signal BANK and output as a write data signal WI. The sense amplifier 14 amplifies the amplified write data signal WI on the selected bit line pair BL in response to the sense amplifier activation signal SE. Thus, the amplified signal is written in the memory cell array 13.

A read operation will be described in more detail with reference to FIGS. 2A to 2J.

First, an active command is issued to the bank 10 where a read data is stored. After that, a read command is issued to the activated bank to read out the data. Thus, the read operation is carried out through 2 steps, as shown in FIG. 2B.

When the active command is issued to the bank 10 at clock C4, the command decoder activates the row address strobe signal ARAS and the bank activation signal BANK is generated. The latch circuit 17 latches the row address strobe signal ARAS and delays the row address strobe signal ARAS by one clock of the internal clock signal ICLK to output as the word activation signal XE at clock C5, as shown in FIG. 2D. When the word activation signal XE is activated, one of the word lines WL is selected by the row address decoder 12, as shown in FIG. 2I. Also, the column address decoder 11 selects one of the bit line pairs BL based on the bank selection signal BANK and the column address signal YADD2. As a result, a voltage difference corresponding to the read data of the memory cell array 13 appears on the selected bit line pair BL, as shown in FIG. 2H.

The latch circuit 18 delays the word activation signal XE by one clock of the internal clock signal ICLK such that the sense amplifier activation signal SE is activated at clock C6, as shown in FIG. 2E. The voltage difference on the selected bit line pair BL is amplified by the sense amplifier 14 when the sense amplifier activation signal SE is activated. Thus, the operation of the active command to the bank 10 is completed.

After that, the read command is inputted and the operation moves to the read operation. The read command to the same bank is issued after a time determined based on the operating time of the circuit after the active command is issued. FIGS. 2A to 2J are an example that the read command is issued to another bank 20. Therefore, a read command is issued at clock C5. Because the operation after the read command is issued is the same, it is supposed that the read command is issued one to the bank 10 at clock C5.

When the read command to the bank 10 is issued in the clock C5, the read signal READ is activated and the read operation to the bank 10 is started. The data amplifier activation signal DE is activated in synchronism with the internal clock signal ICLK at clock C6 and the data amplifier 15 is activated. When the data amplifier 15 is activated, the read data is transferred onto the internal bus RWBUS. The read data transferred onto the internal bus RWBUS is latched by the latch circuit and is then outputted to an external unit.

In this way, a time until the sense amplifier activation signal SE is activated after the word activation signal XE is activated corresponds to one cycle of the external clock signal independently from the influence of a process condition, a temperature condition and a voltage condition.

In DRAM in recent years, the external clock signal of 300/400 MHz (one time period of 3.3/2.5 ns) is used. FIG. 3 shows a circuit which generates the word activation signal XE and the sense amplifier activation signal SE. This circuit is equivalent to a circuit of the latch circuit 17 and the latch circuit 18 shown in FIG. 5 and is composed of a delay circuit 72, a shift register 71 of a 5-stage of flip-flops operating in synchronism with the internal clock signal ICLK. The delay circuit 72 delays the row address strobe signal ARAS by γ time and generates the word activation signal XE. The shift register 71 delays the row address strobe signal ARAS and generates the sense amplifier activation signal SE. The delay circuit 72 functions as a buffer to transfer the word activation signal XE, and the delay time γ is very small. A time until the sense amplifier activation signal SE is activated after the word activation signal XE is activated is determined based on a time when data is read out from the memory cell array 13 onto the selected bit line pair BL. If the sense amplifier activation signal SE is activated to drive the sense amplifier 14 when the voltage difference on the selected bit line pair BL is not large, an erroneous operation is caused. Therefore, the time until the sense amplifier activation signal SE is activated after the word activation signal XE is activated can not be simply shortened even if the frequency of the external clock signal is made high. In the above example, the time is 12.5 ns. In case of the external clock signal of 400 MHz, the sense amplifier activation signal SE is generated by a shift register 71 after the row address strobe signal ARAS by five clocks (12.5 ns) of the internal clock signal ICLK.

FIGS. 4A to 4F are timing charts showing an operation when the external clock signal has the frequency of 400 MHz. The shortest time until the read command is issued after the active command is issued is tRCDmin which is set to be 7 clocks of the external clock signal (17.5 ns), considering the operating time of the circuit. When the active command is received at clock C0, the row address strobe signal ARAS is activated and the word activation signal XE is activated by a delay circuit 72 of FIG. 3. The row address strobe signal ARAS is delayed by the shift register 71 and the sense amplifier activation signal SE is activated at clock c5 after 5 clocks from the row address strobe signal ARAS. When the read command is received at clock C7, the data amplifier activation signal DE is activated.

By the way, although being not written in Japanese Laid Open Patent Application (JP-A-Heisei 08-129887), it is well known that the sense amplifier selection signal YS is activated before the data amplifier activation signal DE is activated, and the read data with a small voltage difference appears as the read data signal RO. When the read command is received, the sense amplifier selection signal YS is first activated. Then, after read data with the small voltage difference is outputted as the read data signal RO, the data amplifier activation signal DE is activated to amplify the read data signal RO.

As described above, the time until the sense amplifier activation signal SE is activated after the row address strobe signal ARAS is activated is 12.5 ns, and the time until the sense amplifier selection signal YS is activated after the sense amplifier activation signal SE is activated is 5.0 ns. These delay times depend on the period of the external clock signal and are kept 12.5 ns and 5.0 ns without depending on influences of a process condition, a temperature condition, and a voltage change.

FIGS. 5A to 5F are timing charts showing the operation when the external clock signal has the frequency of 300 MHz. If the read command is issued after seven clocks from the issuing time of the active command, like the 400-MHz operation, the shortest time tRCDmin until the read command is issued after the active command is issued is 23.1 ns. In this case, because the efficiency drops from 17.5 ns in case of the 400-MHz operation to 23.1 ns in the 300-MHz operation, the delay time is generally set to six clocks in case of the 300-MHz operation to shorten the shortest time tRCDmin to 19.8 ns.

In this case, the time until the sense amplifier activation signal SE is activated after the row address strobe signal ARAS is activated is 16.5 ns for five clocks of the internal clock signal CLK. The time tRCDmin is 19.8 ns because it is equivalent to six clocks of the internal clock signal ICLK. The time until the sense amplifier selection signal YS is activated after the sense amplifier activation signal SE is activated is 3.3 ns. In this case, a necessary delay can not be achieved and the degradation of the sense margin is led and the stable operation is impossible.

To overcome this problem, it is necessary that the time tRCDmin is set to seven clocks (23.1 ns) or a delay represented by an inverter chain which generate a delay time without depending on the clock signal period is used for a circuit which generates the sense amplifier activation signal SE, under permission of the efficiency degradation. However, it is difficult that the delay of the inverter chain achieves the operation margin stable in all the conditions because it changes depending on a process condition, a temperature condition, and a voltage change.

The technique for excluding the dependency of a clock signal on the power supply voltage and temperature and so on, the following technique is known in Japanese Laid Open Patent Application (JP-P2000-285687A). In this technique, in a synchronous type mask ROM, the pulse widths of a sense amplifier activation signal and a latch signal are determined in synchronism with the rising edge or falling edge of the clock signal after the number of cycles determined in accordance with the number of clocks of a preset latency from a command input signal.

Also, a sense amplifier enable signal generating apparatus is described in Japanese Laid Open Patent Application (JP-A-Heisei 10-199251). In this conventional example, a count section inputs a RASB signal to select a row address of a memory cell array, and a signal is outputted in synchronism with a clock signal. The operation of the count section is stopped when the input of the RASB signal is stopped. A comparator outputs the sense amplifier enable signal to indicate the operation start of a sense amplifier when the count value outputted by the count section reaches a programmed delay time and stops the output of the sense amplifier enable signal when the input of the RASB signal is stopped.

SUMMARY OF THE INVENTION

An object of the present invention is to provide a clock signal synchronous type semiconductor memory device, in which a delay time is optimal to each of predetermined frequencies.

Another object of the present invention is to provide a clock signal synchronous type semiconductor memory device of less dependency of a delay time on a process condition, a temperature condition, and a voltage change.

Also, another object of the present invention is to provide a clock signal synchronous type semiconductor memory device which stably operates in each of used frequencies.

Also, another object of the present invention is to provide a system which can draw out original performance sufficiently.

In an aspect of the present invention, a synchronous type semiconductor memory device includes a memory cell array in which memory cells are arranged in a matrix; a row address decoder which activates one of word lines in said memory cell array based on a row address in response to a word activation signal; a column decoder which activates one of bit line pairs in said memory cell array based on a column address; and a sense amplifier circuit which amplifies a voltage difference on the activated bit line pair in response to a sense amplifier activation signal. The synchronous type semiconductor memory device further includes a clock data storage section which stores clock data showing a frequency or period of an external clock signal; and a control section which generates the word activation signal based on a row address strobe signal, and generates the sense amplifier activation signal based on the clock data and the row address strobe signal in response to an internal clock signal synchronous with the external clock signal.

Here, the control section may include an operation timing signal generating section which receives the row address strobe signal, generates the word activation signal based on the row address strobe signal, and generates a plurality of candidate sense amplifier activation signals based on the row address strobe signal in response to the internal clock signal; and a selecting section which selects one of the plurality of candidate sense amplifier activation signals as the sense amplifier activation signal based on the clock data.

In this case, the operation timing signal generating section may include a buffer which receives the row address strobe signal, and outputs the word activation signal; and a sequence of delay elements which shifts the row address strobe signal in response to the internal clock signal, and outputs the plurality of candidate sense amplifier activation signals from different ones of the delay elements.

In this case, each of the delay elements is a flip-flop, and at least one of the delay elements is triggered by a falling edge of the internal clock signal and remaining ones of the delay elements are triggered by a rising edge of the internal clock signal.

Also, the synchronous type semiconductor memory device may further include a data amplifier which amplifies and outputs data corresponding to the amplified voltage difference on the activated bit line pair in response to a data amplifier activation signal. The control section generates the data amplifier activation signal based on the clock data and a column address strobe signal in response to the internal clock signal.

In this case, the control section may include an operation timing signal generating section and a selecting section. The operation timing signal generating section receives the row address strobe signal, generates the word activation signal based on the row address strobe signal, generates a plurality of candidate sense amplifier activation signals based on the row address strobe signal in response to the internal clock signal, and generates a plurality of candidate data amplifier activation signals based on the column address strobe signal in response to the internal clock signal. The selecting section selects one of the plurality of candidate sense amplifier activation signals as the sense amplifier activation signal based on the clock data, and selects one of the plurality of candidate data amplifier activation signals as the data amplifier activation signal based on the clock data.

In this case, the operation timing signal generating section may include a buffer, a sequence of first delay elements and a sequence of second delay elements. The buffer receives the row address strobe signal, and outputs the word activation signal. The sequence of first delay elements shifts the row address strobe signal in response to the internal clock signal, and outputs the plurality of candidate sense amplifier activation signals from different ones of the first delay elements. The sequence of second delay elements shifts the column address strobe signal in response to the internal clock signal, and outputs the plurality of candidate data amplifier activation signals from different ones of the second delay elements.

Also, each of the first and second delay elements may be a flip-flop, and at least one of the first delay elements is triggered by a falling edge of the internal clock signal and remaining ones of the first delay elements are triggered by a rising edge of the internal clock signal. Also, at least one of the second delay elements is triggered by a falling edge of the internal clock signal and remaining ones of the second delay elements are triggered by a rising edge of the internal clock signal.

In another aspect of a method of accessing a memory cell array in a synchronous type semiconductor memory device according to the present invention, the method is achieved by (a) generating a word activation signal based on a row address strobe signal; by (b) generating a sense amplifier activation signal based on clock data, showing a frequency or period of an external clock signal, and the row address strobe signal in response to an internal clock signal synchronous with the external clock signal; by (c) activating one of word lines based on a row address in response to the word activation signal; by (d) activating one of bit line pairs based on a column address; and by (e) amplifying data corresponding to the activated bit line pair and the activated word line in response to the sense amplifier activation signal.

Here, the (b) generating may be achieved by (f) generating a plurality of candidate sense amplifier activation signals based on the row address strobe signal in response to the internal clock signal; and by selecting one of the plurality of candidate sense amplifier activation signals as the sense amplifier activation signal based on the clock data.

In this case, the (f) generating may be achieved by shifting the row address strobe signal in a sequence of first delay elements in response to the internal clock signal; and by outputting the plurality of candidate sense amplifier activation signals from different ones of the first delay elements.

In this case, each of the first delay elements may be a flip-flop, and it is desirable that at least one of the first delay elements is triggered by a falling edge of the internal clock signal and remaining ones of the first delay elements are triggered by a rising edge of the internal clock signal.

Also, the method may be achieved by further carrying out (g) generating a data amplifier activation signal based on the clock data and a column address strobe signal in response to the internal clock signal; and amplifying the amplified data in response to the data amplifier activation signal.

Here, the (g) generating may be achieved by (h) generating a plurality of candidate data amplifier activation signals based on the column address strobe signal in response to the internal clock signal; and by selecting one of the plurality of candidate data amplifier activation signals as the data amplifier activation signal based on the clock data.

In this case, the (h) generating may be achieved by shifting the column address strobe signal in a sequence of second delay elements in response to the internal clock signal; and by outputting the plurality of candidate data amplifier activation signals from different ones of the second delay elements.

Also, each of the second delay elements may be a flip-flop, and it is desirable that at least one of the second delay elements is triggered by a falling edge of the internal clock signal and remaining ones of the second delay elements are triggered by a rising edge of the internal clock signal.

BRIEF DESCRIPTION OF THE DRAWINGS

FIG. 1 is a block diagram showing the arrangement of a conventional clock signal synchronous type semiconductor memory device;

FIGS. 8A to 8H are timing charts showing an operation of synchronous type semiconductor memory device in the embodiment in case of the frequency of 400 MHz; and FIGS. 9A to 9H are timing charts showing an operation of synchronous type semiconductor memory device in the embodiment in case of the frequency of 300 MHz.

DESCRIPTION OF THE PREFERRED EMBODIMENTS

Hereinafter, a clock synchronous type semiconductor memory device of the present invention will be described.

Figures 2A, 2B, 2C, 2D, 2E, 2F, 2G, 2H, 2I, 2J:
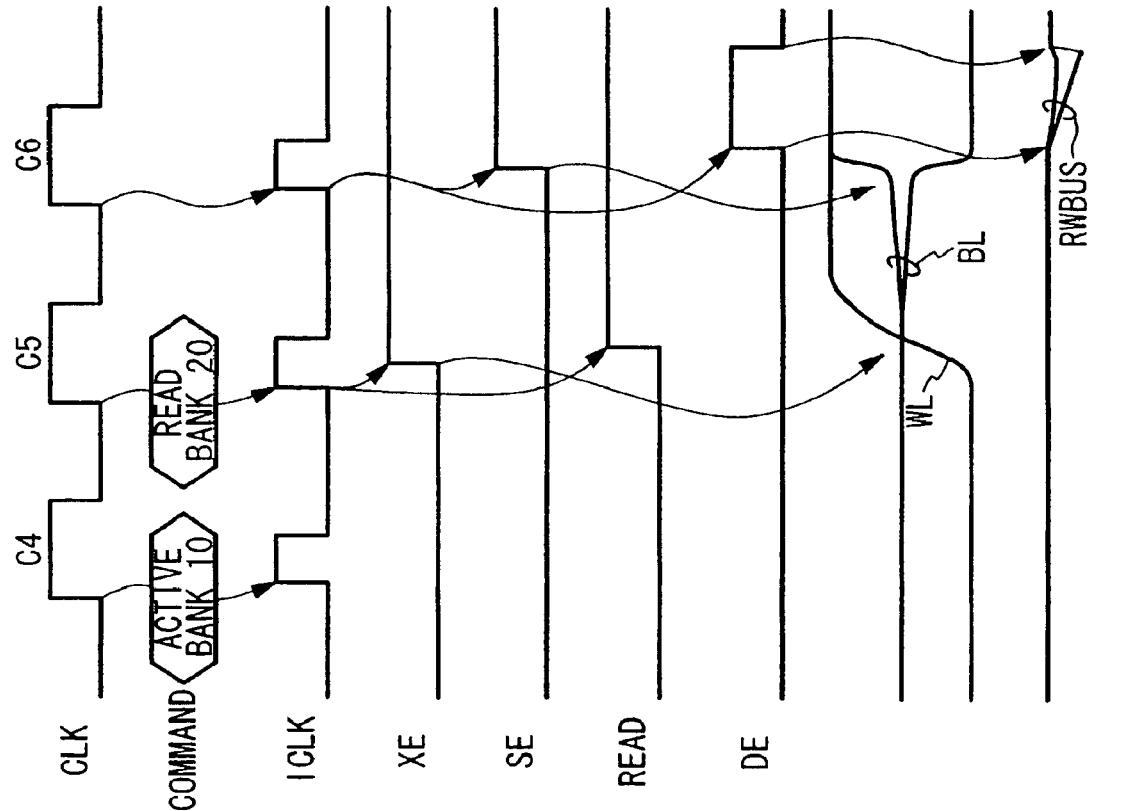
FIGS. 2A to 2J are timing charts showing an operation of the conventional clock signal synchronous type semiconductor memory device.
Figure 3:
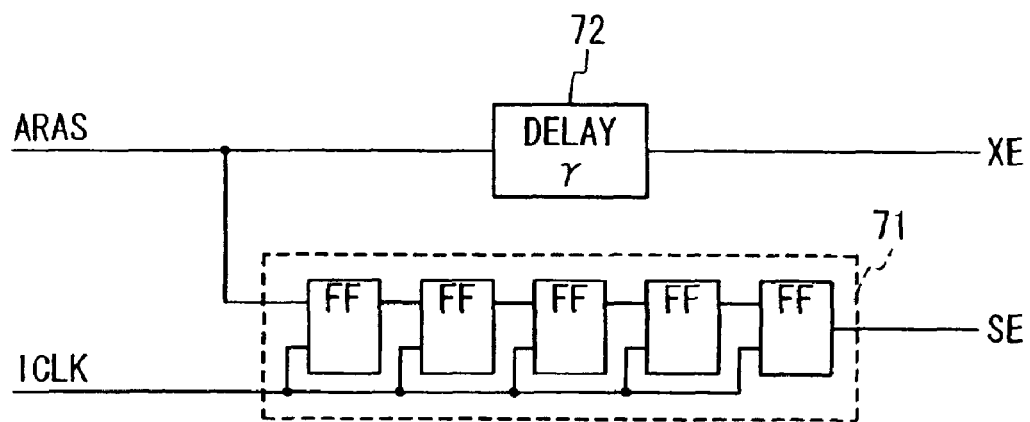
FIG. 3 is a circuit diagram showing a timing generating circuit to generate sense amplifier activation signal.
Figure 4:
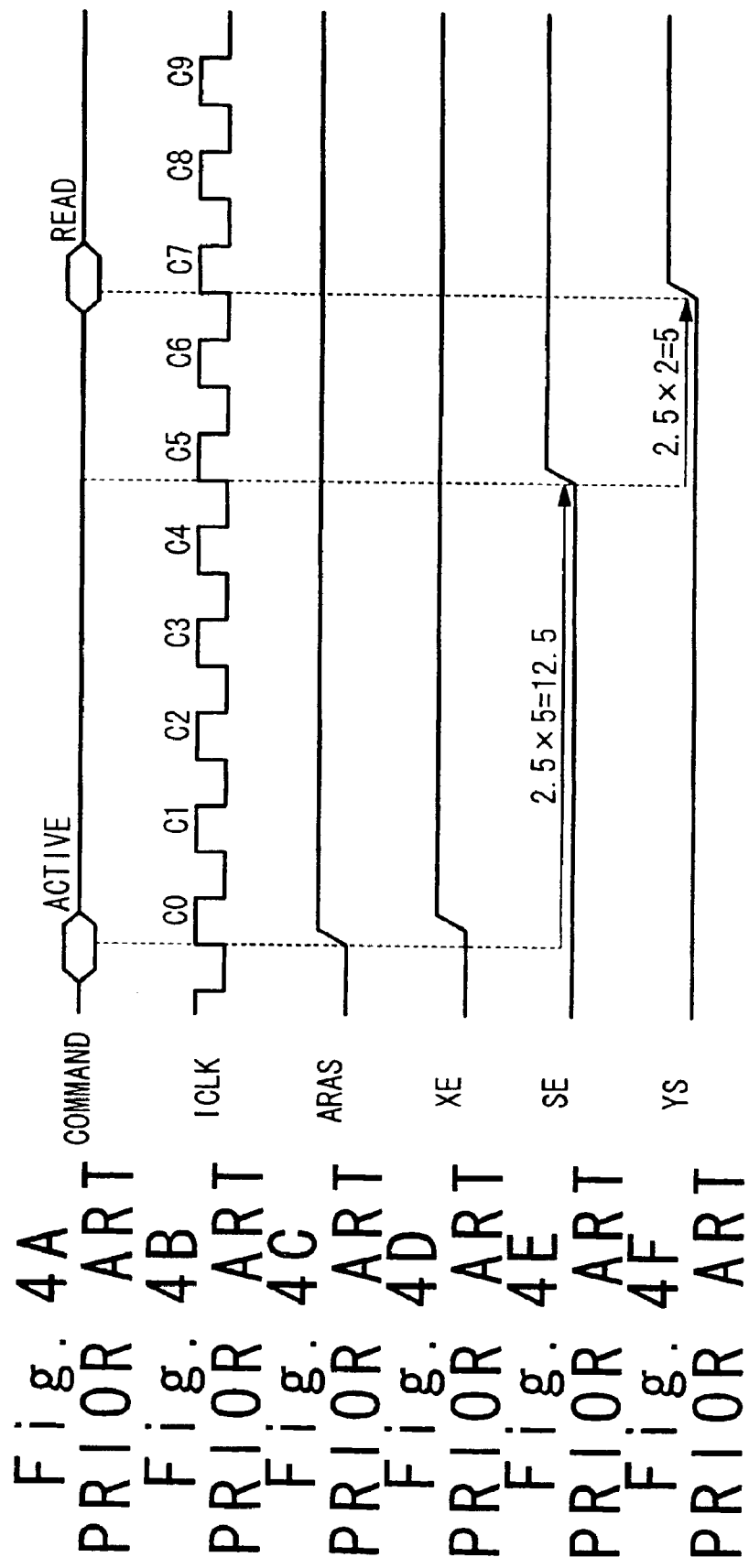
FIGS. 4A to 4F are timing chart showing an operation of the conventional clock signal synchronous type semiconductor memory device in case of the frequency of 400 MHz.
Figure 5:
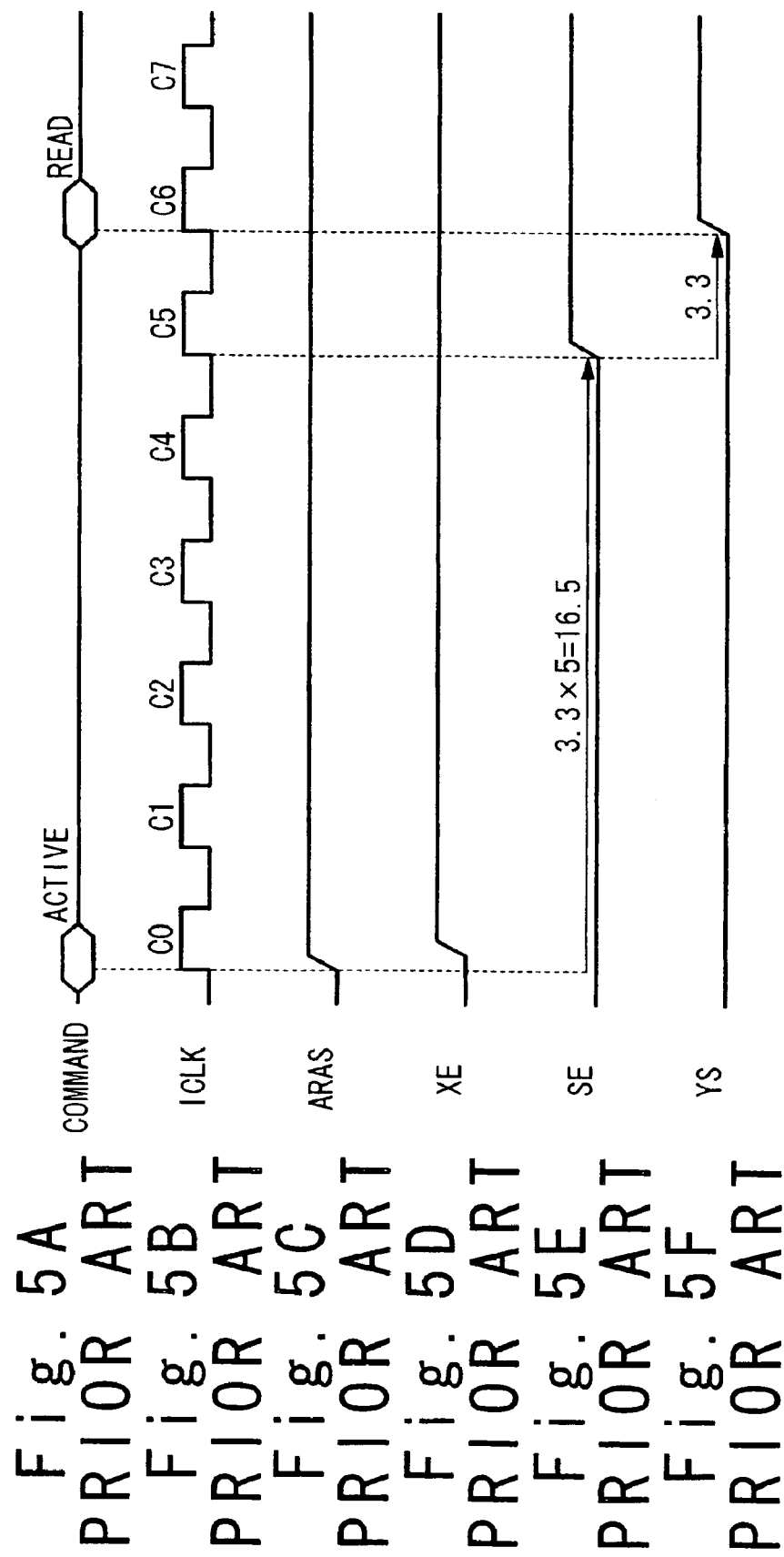
FIGS. 5A to 5F are timing chart showing an operation of the conventional clock signal synchronous type semiconductor memory device in case of the frequency of 300 MHz.
Figure 6:
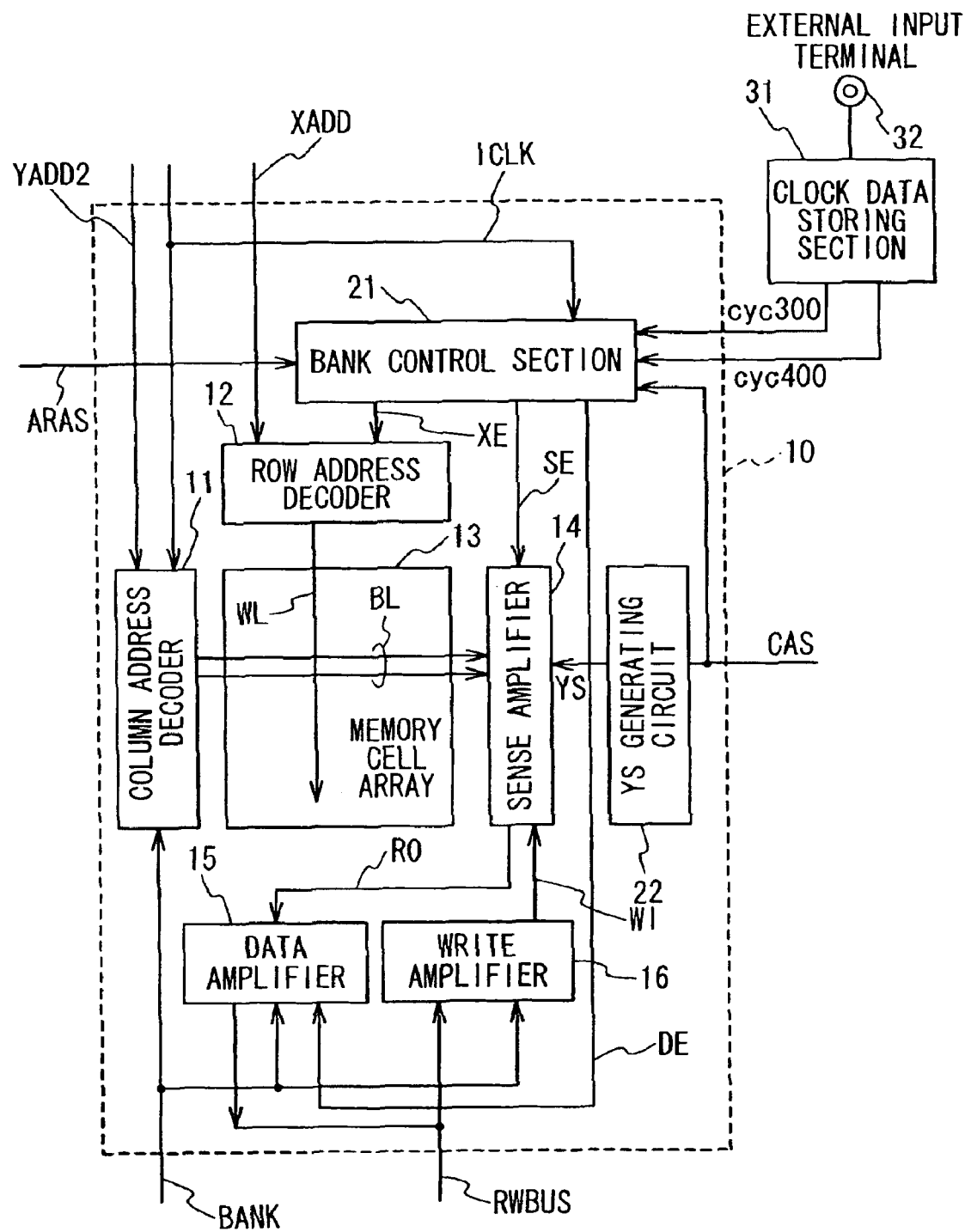
FIG. 6 is a block diagram showing the arrangement of a synchronous type semiconductor memory device according to an embodiment of the present invention.

FIG. 6 shows the arrangement of a circuit of a bank and a clock data storage section 31 provided for a common circuit section in the clock synchronous type semiconductor memory device according to an embodiment of the present invention. The clock synchronous type semiconductor memory device generally includes a plurality of banks and the circuit to control the plurality of banks is provided in common to the banks. Such an example is well known to a person in the art and is not shown. Although the clock data storage section 31 is provided for a common circuit section, it is supposed in this embodiment that because the clock data storage section 31 is provided for every bank.

The clock data storage section 31 includes a register to store clock data, for example, showing the frequency of an external clock signal. In this example, clock data, e.g., a code 1 or a code 0 can be stored to show the clock signal frequencies of 400 MHz and 300 MHz. The clock data is one bit. The number of kinds of the external clock signal may be equal to or more than three and the clock data storage section 31 stores the clock data to distinguish them. The clock data is supplied from an external unit through an external input terminal 32 at any time and stored in the register. Also, the clock data may be previously set during manufacturing, for example, by using a fuse circuit and a bonding option. The clock data, still referring to FIG. 6, is outputted as cyc300 or cyc400, which corresponds to the external clock signal of 300 MHz or 400 MHz, respectively.

The bank 10 is composed of a memory cell array 13, a YS generation circuit 22, a control section 21, a row address decoder 12, a column address decoder 11, a write amplifier 16, a sense amplifier circuit 14, and a data amplifier 15.

The cell array 13 has a plurality of memory cells arranged in a matrix. The YS generation circuit 22 generates a sense amplifier selection signal YS from a column address strobe signal CAS in synchronism with an internal clock signal ICLK and is used to select one of sense amplifiers of the sense amplifier circuit 14.

The control section 21 inputs a row address strobe signal ARAS and the column address strobe signal CAS and generates a word activation signal XE, a sense amplifier activation signal SE, and a data amplifier activation signal DE based on the clock data from the clock data storage section 31 in response to the internal clock signal ICLK.

The row address decoder 12 selects one of word lines WL based on a row address signal XADD in response to the word activation signal XE. The column address decoder 11 inputs a column address signal YADD2 and a bank activation signal BANK, and selects one of bit line pairs BL in synchronism with internal clock signal ICLK.

The write amplifier 16 amplifies a write data signal WI on the internal bus RWBUS based on the bank selection signal BANK. The sense amplifier circuit 14 has sense amplifiers and one of them is selected based on the sense amplifier selection signal YS. The selected sense amplifier amplifies data read out from the cell array 13 onto the bit line pair BL in response to the sense amplifier activation signal SE and outputs as a read data signal RO, in a read operation. The sense amplifier circuit 14 amplifies a write data signal WI on the bit line pair BL in response to the sense amplifier activation signal SE in the write operation, and the write data signal is written in a memory cell of the cell array 13. The data amplifier 15 amplifies and outputs the read data signal RO onto the internal bus RWBUS based on a data amplifier activation signal DE, and a bank activation signal BANK.

Figure 7:
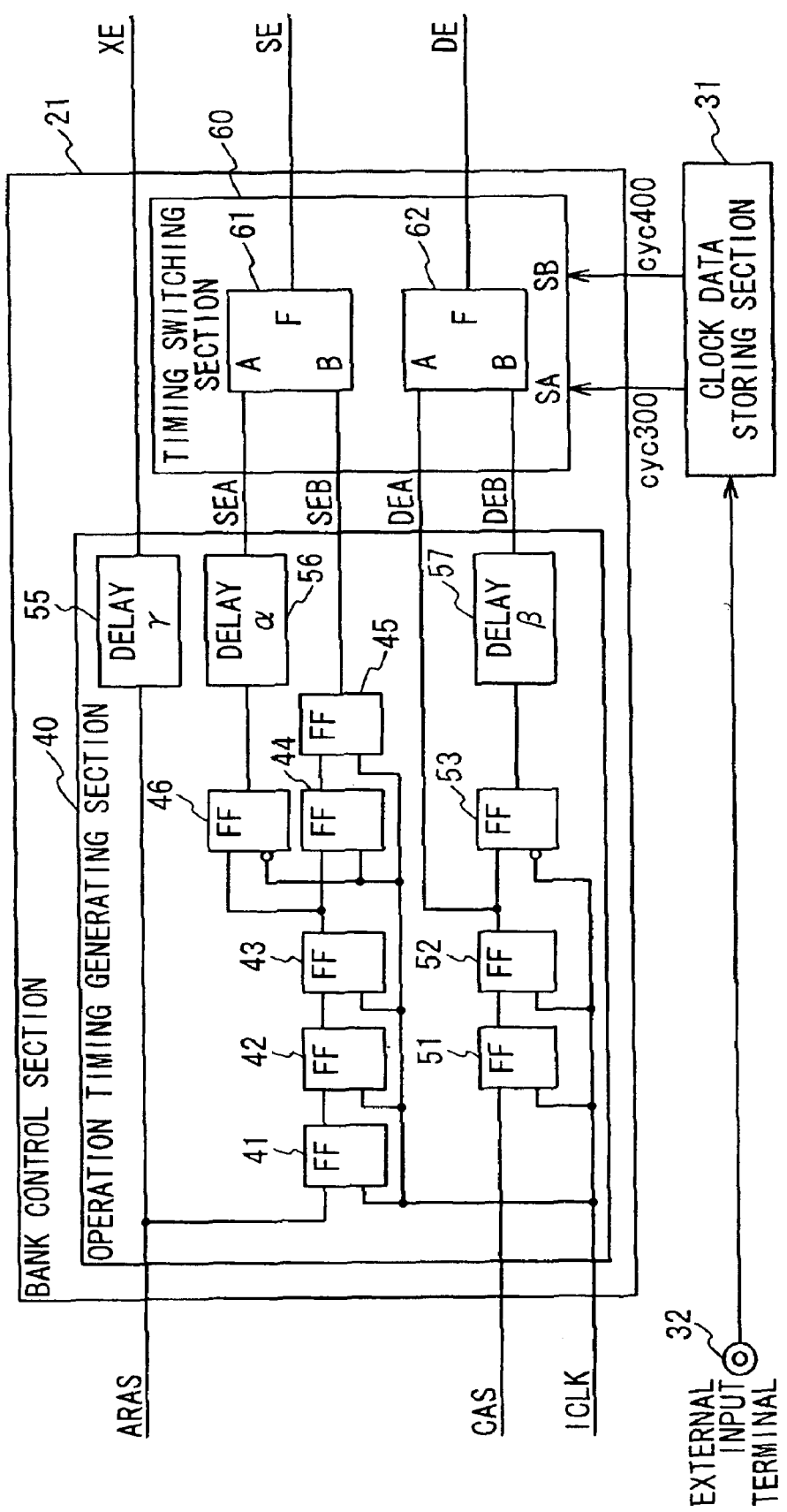
FIG. 7 is a block diagram showing the arrangement of a control section.

The control section 21 is composed of an operation timing generating section 40 and a selecting section 60, as shown in FIG. 7. The operation timing generating section 40 includes a buffer 55 with a delay time γ, a first delay section of a first sequence of flip-flops (41 to 45) and a buffer 56 with a delay time α and a second delay section of a second sequence of flip-flops (51 to 53) and a buffer 57 with a delay time β.

The buffer 55 receives the row address strobe signal ARAS and outputs the row address decoder activation signal XE. The first delay section shifts in synchronism with the internal clock signals ICLK and generates a plurality of candidate sense amplifier activation signals SEA and SEB. The second delay section shifts the column address strobe signal CAS in synchronism with the internal clock signals ICLK and generates a plurality of candidate data amplifier activation signals DEA and DEB.

In the first delay section, the flip-flops 41 to 45 are connected in series. Each of the flip-flops 41 to 45 receives the row address strobe signal ARAS and is triggered at the rising edge of the internal clock signal ICLK. The output of the flip-flop 45 is the candidate sense amplifier activation signal SEB. The flip-flop 46 is connected with the output of the flip-flop 43 and is triggered at the falling edge of the internal clock signal ICLK. The output of the flip-flop 46 is connected with the buffer 56, which outputs the candidate sense amplifier activation signal SEA. In the second delay section, the flip-flops 51 and 52 are connected in series. Each of the flip-flops 51 and 52 receives the column address strobe signal CAS and is triggered at the rising edge of the internal clock signal ICLK. The output of the flip-flop 52 is the candidate data amplifier activation signal DEA. The flip-flop 53 is connected with the output of the flip-flop 52 and is triggered at the falling edge of the internal clock signal ICLK. The output of the flip-flop 53 is connected with the buffer 57, which outputs the candidate data amplifier activation signal DEB.

As for the row address strobe signal ARAS, the delay time for 3.5 clocks is produced by the flip-flops 41, 42, 43 and 46 and the delay time for 5 clocks is produced by the flip-flops 41, 42, 43, 44 and 45. As for the column address strobe signal CAS, the delay time for 2 clocks is produced by the flip-flops 51 and 52 and the delay time for 2.5 clocks is produced by the flip-flops 51, 52 and 53.

In this way, the operation timing generating section generates the word activation signal XE, two kinds of candidate sense amplifier activation signals SEA and SEB, and two kinds of candidate data amplifier activation signals DEA and DEB. The word activation signal XE is delayed by the buffer 55 by the delay time y from the row address strobe signal ARAS. Moreover, two kinds of candidate sense amplifier activation signals SEA and SEB are generated from the row address strobe signal ARAS. The candidate sense amplifier activation signal SEA is delayed by 3.5 clocks of the internal clock signal+α from the row address strobe signal ARAS and the candidate sense amplifier activation signal SEB is delayed by 5 clocks of the internal clock signal ICLK from the row address strobe signal ARAS. The two kinds of candidate data amplifier activation signals DEA and DEB are generated from the column address strobe signal CAS. The candidate data amplifier activation signal DEA is delayed by 2 clocks of the internal clock signal ICLK from the column address strobe signal CAS and the of the internal clock signal DEB is delayed by 2.5 clocks of the internal clock signal ICLK+β from the column address strobe signal CAS.

The selecting section 60 selects one of the candidate sense amplifier activation signals SEA and SEB generated by the operation timing generating section 40 based on the clock data from the clock data storage section 31. The clock data cyc300 or the clock data cyc400 is supplied from the clock data storage section 31 to indicate that the external clock signal is of 300 MHz or 400 MHz. The selecting section 60 is composed of a selector circuit 61 and a selector circuit 62. The selector circuit 61 selects as the sense amplifier activation signal SE one of the candidate sense amplifier activation signal SEA connected with the side of A and the candidate sense amplifier activation signal SEB connected with the side of B. The selector circuit 62 selects as the data amplifier activation signal DE one of the candidate data amplifier activation signal DEA connected with the side of A and the candidate data amplifier activation signal DEB connected with the side of B. The sides of A of the selector circuit 61 and selector circuit 62 are selected based on the clock data cyc300 and the sides of B of the selector circuit 61 and selector circuit 62 are selected based on the clock data cyc400.

FIGS. 8A to 8H are timing charts showing the operation when the data cyc400 is outputted from the clock data storage section 31 (in case of the operation in the external clock signal of 400 MHz). The active command is inputted at clock C0 and the read command is inputted at clock C7. Thus, the time tRCD from the determination of a row address based on an active command to the determination of a column address based on a read command is seven clocks. The selecting section 60 is set to the state that the side of B is selected.

When the active command is received at the clock C0, the row address strobe signal ARAS is activated and the word activation signal XE is activated after the delay time γ by the buffer 55. The sense amplifier activation signal SEB is activated after five clocks from the row address strobe signal ARAS. This signal is selected as the sense amplifier activation signal SE by the selecting section 60 to activate the sense amplifier 14. The delay time until the sense amplifier activation signal SE is activated after the row address strobe signal ARAS is activated is 12.5 ns (=5 clocks×2.5 ns).

When the read command is received at the clock C7, the column address strobe signal CAS is activated, and the sense amplifier selection signal YS is generated by the YS generation circuit 22 in synchronism with the internal clock signal ICLK. On the other hand, the column address strobe signal CAS is supplied to the operation timing generating section 40, and the data amplifier activation signal DEB is activated after 2.5 clocks+β from the column address strobe signal CAS. This signal is selected by the selecting section 60 as the data amplifier activation signal DE. The data amplifier 15 is activated based on the data amplifier activation signal DE and read data is outputted. The delay time until the data amplifier activation signal DE is activated after the sense amplifier selection signal YS is activated is about 6.6 ns (=2.5 clock×2.5 ns+β).

Next, the operation when the external clock signal is 300 MHz will be described with reference to timing charts shown in FIGS. 9A to 9H. The clock data cyc300 is outputted from the clock data storage section 31 and the selecting section 60 selects the signals on the side of A. The time tRCD is seven clocks when the external clock signal is 400 MHz. However, in case of the external clock signal is 300 MHz, the time tRCD is set to six clocks which is less than by one clock, and the active command is inputted at the clock C0 and the read command is inputted at clock C6.

When the active command is received at the clock C0, the row address strobe signal ARAS is activated and the word activation signal XE is activated after the delay time γ by the buffer 55. The sense amplifier activation signal SEA is activated after 3.5 clocks+α from the row address strobe signal ARAS and is selected as the sense amplifier activation signal SE by the selecting section 60. The sense amplifier 14 is activated in response to the sense amplifier activation signal SE. The delay time until the sense amplifier activation signal SE is activated after the row address strobe signal ARAS is activated is about 12.5 ns (=3.5 cycles×3.3 ns+α).

When the read command is received at the clock C6, the column address strobe signal CAS is activated and the sense amplifier selection signal YS is generated by the YS generation circuit 22 in synchronism with internal clock signal ICLK. On the other hand, the column address strobe signal CAS is supplied to the operation timing generating section 40, and the data amplifier activation signal DEA is activated after two clocks from the column address strobe signal CAS. The selecting section 60 as the data amplifier activation signal DE selects this signal. The data amplifier activation signal DE activates the data amplifier 15 and read data is outputted. The delay time until the data amplifier activation signal DE is activated after the sense amplifier selection signal YS is activated is 6.6 ns (=2 cycles×3.3 ns).

As seen from the above, the time until the sense amplifier activation signal SE is activated after the row address strobe signal ARAS is activated is 12.5 ns (=5 clocks×2.5 ns) in the case of 400 MHz, and is about 12.5 ns (=3.5 cycles×3.3 ns+α) in the case of 300 MHz. Also, the data amplifier activation signal DE is activated 2.5 clocks+β in the case of 400 MHz and 2 cycles in the case of 300 MHz after the column address strobe signal CAS is activated and then the sense amplifier selection signal YS is activated. Then, the read data is outputted. The time until the data amplifier activation signal DE is activated after the sense amplifier selection signal YS is activated is about 6.6 ns (=2.5 clocks×2.5 ns+β) in the case of 400 MHz and is 6.6 ns (=2 clocks×3.3 ns) in the case of 300 MHz, and they are almost the same. Because the delay times α (0.95 ns) and β (0.35 ns) are realized by inverter delays, the change of the delay time occurs depending on a process condition, a temperature condition, a voltage condition and so on. The absolute values of the delay times α and β are 0.95 ns and 0.35 ns and very short times, respectively. However, the change in the delay time depending on the process condition, the temperature condition, the voltage condition and so on becomes small and the influence to the whole delay time is also small.

Also, the time until the sense amplifier selection signal YS is activated after the sense amplifier activation signal SE is activated is 5 ns (=2 clocks×2.5 ns) in the case of 400 MHz and 7.3 ns (=2.5 clocks×3.3 ns−α) in the case of 300 MHz and the stable operation becomes possible.

According to the present invention, it is possible to realize a delay circuit which is stable, which is not influenced by the change in the process condition, the temperature condition, and the voltage condition, and which is appropriate to the operation speed.

Also, according to the present invention, the clock synchronous type semiconductor memory device can be provided in which a stable operation can be achieved in any frequency of the external clock signal by adjusting the delay time based on clock data.

Also, according to moreover the present invention, the times such as $tRCD_{min}$ can be set in accordance with the external clock signal frequency, and a memory system of high performance can be built.

What is claimed is:

1. A synchronous type semiconductor memory device comprising:
    a memory cell array in which memory cells are arranged in a matrix;
    a row address decoder which activates one of word lines in said memory cell array based on a row address in response to a word activation signal;
    a column decoder which activates one of bit line pairs in said memory cell array based on a column address;
    a sense amplifier circuit which amplifies a voltage difference on said activated bit line pair in response to a sense amplifier activation signal;
    a clock data storage section which stores clock data showing a frequency or period of an external clock signal; and
    a control section which generates said word activation signal based on a row address strobe signal, and generates said sense amplifier activation signal based on said clock data and said row address strobe signal in response to an internal clock signal synchronous with said external clock signal.

2. The synchronous type semiconductor memory device according to claim 1, wherein said control section comprises:
    an operation timing signal generating section which receives said row address strobe signal, generates said word activation signal based on said row address strobe signal, and generates a plurality of candidate sense amplifier activation signals based on said row address strobe signal in response to said internal clock signal; and
    a selecting section which selects one of said plurality of candidate sense amplifier activation signals as said sense amplifier activation signal based on said clock data.

3. The synchronous type semiconductor memory device according to claim 2, wherein said operation timing signal generating section comprises:
    a buffer which receives said row address strobe signal, and outputs said word activation signal; and
    a sequence of delay elements which shifts said row address strobe signal in response to said internal clock signal, and outputs said plurality of candidate sense amplifier activation signals from different ones of said delay elements.

4. The synchronous type semiconductor memory device according to claim 3, wherein each of said delay elements is a flip-flop.

5. The synchronous type semiconductor memory device according to claim 4, wherein at least one of said delay elements is triggered by a falling edge of said internal clock signal and remaining ones of said delay elements are triggered by a rising edge of said internal clock signal.

6. The synchronous type semiconductor memory device according to claim 1, further comprising:
    a data amplifier which amplifies and outputs data corresponding to the amplified voltage difference on said activated bit line pair in response to a data amplifier activation signal,
    wherein said control section generates said data amplifier activation signal based on said clock data and a column address strobe signal in response to said internal clock signal.

7. The synchronous type semiconductor memory device according to claim 6, wherein said control section comprises:
    an operation timing signal generating section which receives said row address strobe signal, generates said word activation signal based on said row address strobe signal, generates a plurality of candidate sense amplifier activation signals based on said row address strobe signal in response to said internal clock signal, and generates a plurality of candidate data amplifier activation signals based on said column address strobe signal in response to said internal clock signal; and
    a selecting section which selects one of said plurality of candidate sense amplifier activation signals as said sense amplifier activation signal based on said clock data, and selects one of said plurality of candidate data amplifier activation signals as said data amplifier activation signal based on said clock data.

8. The synchronous type semiconductor memory device according to claim 7, wherein said operation timing signal generating section comprises:
    a buffer which receives said row address strobe signal, and outputs said word activation signal;
    a sequence of first delay elements which shifts said row address strobe signal in response to said internal clock signal, and outputs said plurality of candidate sense amplifier activation signals from different ones of said first delay elements; and
    a sequence of second delay elements which shifts said column address strobe signal in response to said internal clock signal, and outputs said plurality of candidate data amplifier activation signals from different ones of said second delay elements.

9. The synchronous type semiconductor memory device according to claim 8, wherein each of said first and second delay elements is a flip-flop.

10. The synchronous type semiconductor memory device according to claim 9, wherein at least one of said first delay elements is triggered by a falling edge of said internal clock signal and remaining ones of said first delay elements are triggered by a rising edge of said internal clock signal, and
    at least one of said second delay elements is triggered by a falling edge of said internal clock signal and remaining ones of said second delay elements are triggered by a rising edge of said internal clock signal.

11. A method of accessing a memory cell array in a synchronous type semiconductor memory device, said method comprising:
   (a) generating a word activation signal based on a row address strobe signal;
   (b) stoma a clock data, wherein said clock data is a property of an external clock;
   (c) generating a sense amplifier activation signal based on clock data, showing a frequency or period of an external clock signal, and said row address strobe signal in response to an internal clock signal synchronous with said external clock signal;
   (d) activating one of word lines based on a row address in response to said word activation signal;
   (e) activating one of bit line pairs based on a column address; and
   (f) amplifying data corresponding to said activated bit line pair and said activated word line in response to said sense amplifier activation signal.

12. The method according to claim 11, wherein said (b) generating comprises:
   (g) generating a plurality of candidate sense amplifier activation signals based on said row address strobe signal in response to said internal clock signal; and
   selecting one of said plurality of candidate sense amplifier activation signals as said sense amplifier activation signal based on said clock data.

13. The method according to claim 12, wherein said (g) generating comprises:
   shifting said row address strobe signal in a sequence of first delay elements in response to said internal clock signal; and
   outputting said plurality of candidate sense amplifier activation signals from different ones of said first delay elements.

14. The method according to claim 13, wherein said shifting of said row address strobe signal in response to said internal clock signal is done by a sequence of flip flops.

15. The method according to claim 14, wherein at least one of said flip flops is triggered by a falling edge of said internal clock signal and remaining ones of said flip flops are triggered by a rising edge of said internal clock signal.

16. The method according to claim 11, further comprising:
   (h) generating a data amplifier activation signal based on said clock data and a column address strobe signal in response to said internal clock signal; and
   amplifying said amplified data in response to said data amplifier activation signal.

17. The method according to claim 16, wherein said (h) generating comprises:
   (i) generating a plurality of candidate data amplifier activation signals based on said column address strobe signal in response to said internal clock signal; and
   selecting one of said plurality of candidate data amplifier activation signals as said data amplifier activation signal based on said clock data.

18. The method according to claim 17, wherein said (i) generating comprises:
   shifting said column address strobe signal in a sequence of second delay elements in response to said internal clock signal; and
   outputting said plurality of candidate data amplifier activation signals from different ones of said second delay elements.

19. The method according to claim 18, wherein said shifting of said column address strobe signal is done in a second sequence of flip-flops.

20. The method according to claim 19, wherein at least one flip flop of said sequence of flip flops is triggered by a falling edge of said internal clock signal and remaining ones of said second sequence of flip flops are triggered by a rising edge of said internal clock signal.

* * * * *